(12) United States Patent
Fan

(10) Patent No.: US 8,289,725 B2
(45) Date of Patent: Oct. 16, 2012

(54) PACKAGE SUBSTRATE HAVING EMBEDDED CAPACITOR

(75) Inventor: Chih-Peng Fan, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 155 days.

(21) Appl. No.: 12/851,795

(22) Filed: Aug. 6, 2010

(65) Prior Publication Data

US 2010/0319970 A1   Dec. 23, 2010

Related U.S. Application Data

(62) Division of application No. 11/623,553, filed on Jan. 16, 2007, now abandoned.

(30) Foreign Application Priority Data

Nov. 7, 2006   (TW) ................................. 95141129 A

(51) Int. Cl.
*H05K 7/00* (2006.01)
(52) U.S. Cl. .......... 361/763; 361/61; 361/782; 361/764; 361/795; 174/260

(58) Field of Classification Search .................. 361/763, 361/728, 734, 765, 761, 764, 795, 793; 174/262, 174/760
See application file for complete search history.

(56) References Cited

U.S. PATENT DOCUMENTS

| 7,038,143 B2 * | 5/2006 | Utsumi et al. ................. 174/258 |
| 2006/0138591 A1 * | 6/2006 | Amey et al. .................... 257/532 |

* cited by examiner

*Primary Examiner* — Yuriy Semenenko
*Assistant Examiner* — Andargie M Aychillhum
(74) *Attorney, Agent, or Firm* — J.C. Patents

(57) ABSTRACT

A package substrate having embedded capacitor is provided. The package substrate includes a core circuit board, at least one dielectric layer, at least one embedded capacitor, and at least one metal layer. The core circuit board has at least one wiring layer, and the core circuit board has at least one conductive through hole connected to the wiring layer. At least one dielectric layer covers the wiring layer, and the dielectric layer has at least one conductive through hole. At least one embedded capacitor is embedded in the dielectric layer. At least one metal layer covers the dielectric layer and connected to the embedded capacitor, wherein the metal layer is connected to the wiring layer through the conductive through hole.

10 Claims, 3 Drawing Sheets

PACKAGE SUBSTRATE HAVING EMBEDDED CAPACITOR

CROSS-REFERENCE TO RELATED APPLICATION

This is a divisional application of and claims the priority benefit of patent application Ser. No. 11/623,553, filed on Jan. 16, 2007, now pending, which claims the priority benefit of Taiwan application serial no. 95141129, filed on Nov. 7, 2006. The entirety of each of the above-mentioned patent applications is hereby incorporated by reference herein and made a part of this specification.

BACKGROUND OF THE INVENTION

1. Field of the Invention

The present invention relates to a package substrate, and more particularly to a package substrate having embedded capacitor.

2. Description of Related Art

Embedded capacitor can be integrated into a package substrate in the same fabrication process to enhance the efficiency of the active components inside an electronic package, improve electrical performance and lower assembling cost. Therefore, it has become the mainstream method for fabricating electronic carrier. At present, the development of embedded capacitor is mainly aiming toward small size ceramic capacitors. In general, ceramic capacitors can be classified into single layer ceramic capacitors (SLCC) and multi-layer ceramic capacitors (MLCC), also known as discrete capacitors. However, because the capacitance of the conventional discrete capacitor is low and has a low dielectric constant, they could hardly enhance the performance of a conventional circuit substrate.

FIG. 1 is a schematic diagram of a conventional package substrate having embedded capacitor. The internal structure of the package substrate 100 and its fabrication process are roughly as follows. First, a core board 110, a plurality of dielectric materials 121~124 and two copper foils 142 and 144 soldered with a plurality of discrete capacitors 130 are provided. Then, the dielectric materials 121~124 and the two copper foils 142 and 144 having the discrete capacitors 130 are aligned and compressed to the core board 110. Thus, the two copper foils 142 and 144 and the discrete capacitors 130 are located between the upper dielectric materials 121, 122 and the lower dielectric materials 123, 124 respectively to form a core laminated board 160. Thereafter, a mechanical drilling process is performed to form a plurality of conductive through holes 150 inside the core laminated board 160 that averts the discrete capacitors 130 and connects the upper and lower copper foils 142 and 144. In addition, a surface circuit 162 of the core laminated board 160 can connect with the discrete capacitors 130 through the via hole 164.

Because the discrete capacitors 130 have to avert the conductive through hole 150, the usable area and location for disposing the capacitors 130 are constrained by the number and locations of the conductive through holes 150 and the degree of freedom of disposing the capacitors 130 is lowered. In the meantime, the discrete capacitors 130 are easily damaged or broken in the process of compressing the substrate. As a result, the reliability of the capacitors 130 is lowered.

SUMMARY OF THE INVENTION

Accordingly, the present invention directs to a package substrate having embedded capacitor for enhancing the space and degree of freedom of disposing the embedded capacitor.

The present invention also directs to a package substrate having embedded capacitor such that the performance of the package substrate is enhanced by using a dielectric material with high dielectric constant and low dielectric loss.

The present invention directs to a package substrate having embedded capacitor such that the embedded capacitor is protected from damage by covering it with a passivation layer.

The present invention provides a package substrate having embedded to capacitor. The package substrate includes a core circuit board, at least one dielectric layer, at least one embedded capacitor and at least one metal layer. At least one wiring layer is disposed on a surface of the core circuit board and a conductive through hole of the core circuit board is connected to the wiring layer. In addition, the dielectric layer covers the wiring layer and has at least one via hole. Furthermore, the embedded capacitor is connected to the metal layer and is embedded within the dielectric layer. The metal layer covers the dielectric layer and connects to the wiring layer through the via hole.

The present invention also provides a package substrate having embedded capacitor. The package substrate includes a first core circuit board, at least one embedded capacitor, a second core circuit board and a dielectric layer. At least one metal layer is disposed on a surface of the first core circuit board and at least one first conductive through hole of the first core circuit board is connected to the metal layer. In addition, the embedded capacitor is embedded within the first core circuit board and connected to the metal layer. A wiring layer is disposed on a surface of the second core circuit board and at least one second conductive through hole of the second core circuit board is connected to the wiring layer. Furthermore, the dielectric layer is laminated between the first core circuit board and the second core circuit board.

The present invention also provides a package substrate having embedded capacitor. The package substrate includes a core circuit board, at least one embedded capacitor, at least one dielectric layer and at least one wiring layer. At least one metal layer is disposed on a surface of the core circuit board and at least one conductive through hole of the core circuit board is connected to the metal layer. In addition, the embedded capacitor is embedded within the core circuit board and connected to the metal layer. The dielectric layer covers the wiring layer and has an embedded hole. Furthermore, the wiring layer covers the dielectric layer and is electrically connected to the embedded hole.

According to an embodiment of the present invention, the package substrate further includes a first passivation layer covering the embedded capacitor. In addition, the metal layer has an opening and the opening exposes a surface of the embedded capacitor. The package substrate further includes a second passivation layer covering the surface of the embedded capacitor. The first passivation layer is fabricated using epoxy resin or polyimide, and the second passivation layer can be fabricated using epoxy resin or polyimide too.

According to an embodiment of the present invention, the package substrate further includes at least one surface wiring layer disposed on a surface of the package substrate. The surface wiring layer has at least one contact electrically connected to the metal layer or the wiring layer. In addition, the package substrate further includes a solder mask layer covering the surface wiring layer. The solder mask layer has at least one opening that exposes the contact.

The present invention also provides a package substrate having embedded capacitor. The package substrate includes a core board, an embedded capacitor, a first passivation layer and a metal layer. The embedded capacitor is embedded within the core board and the first passivation layer covers the embedded capacitor. In addition, the metal layer covers the core board and is connected to the embedded capacitor.

According to an embodiment of the present invention, the metal layer has an opening and the opening exposes a surface of the embedded capacitor. The package substrate further includes a second passivation layer covering the surface of the embedded capacitor. The first passivation layer is fabricated using epoxy resin or polyimide, and the second passivation layer can be fabricated using epoxy resin or polyimide too.

Due to the improvement in the substrate structure, the embedded capacitor in the present invention can be disposed in a suitable location without having to avert the conductive through hole. Therefore, the space and degree of freedom for disposing the embedded capacitors is enhanced. In addition, capacitors fabricated using high dielectric constant and low dielectric loss material such as polymer-ceramic composite can be used instead of the conventional discrete capacitors so as to enhance the performance of the package substrate. Furthermore, the embedded capacitors of the present invention is covered with at least one passivation layer to prevent the embedded capacitors from receiving possible damage in the process of compressing the substrate. Hence, overall reliability of the package substrate is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
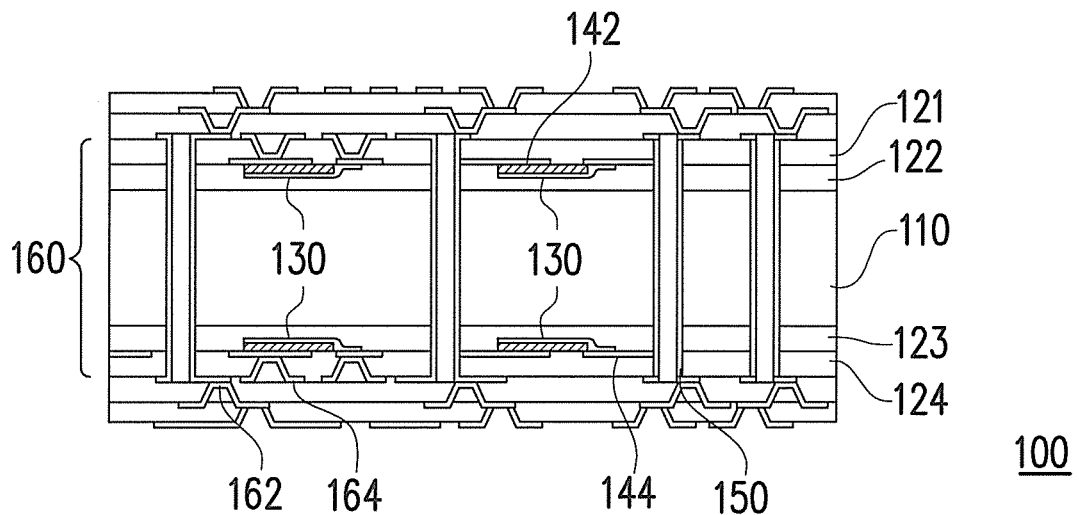
FIG. 1 is a schematic diagram of a conventional package substrate having embedded capacitor.

Reference will now be made in detail to the present preferred embodiments of the invention, examples of which are illustrated in the accompanying drawings. Wherever possible, the same reference numbers are used in the drawings and the description to refer to the same or like parts.

Figure 2:
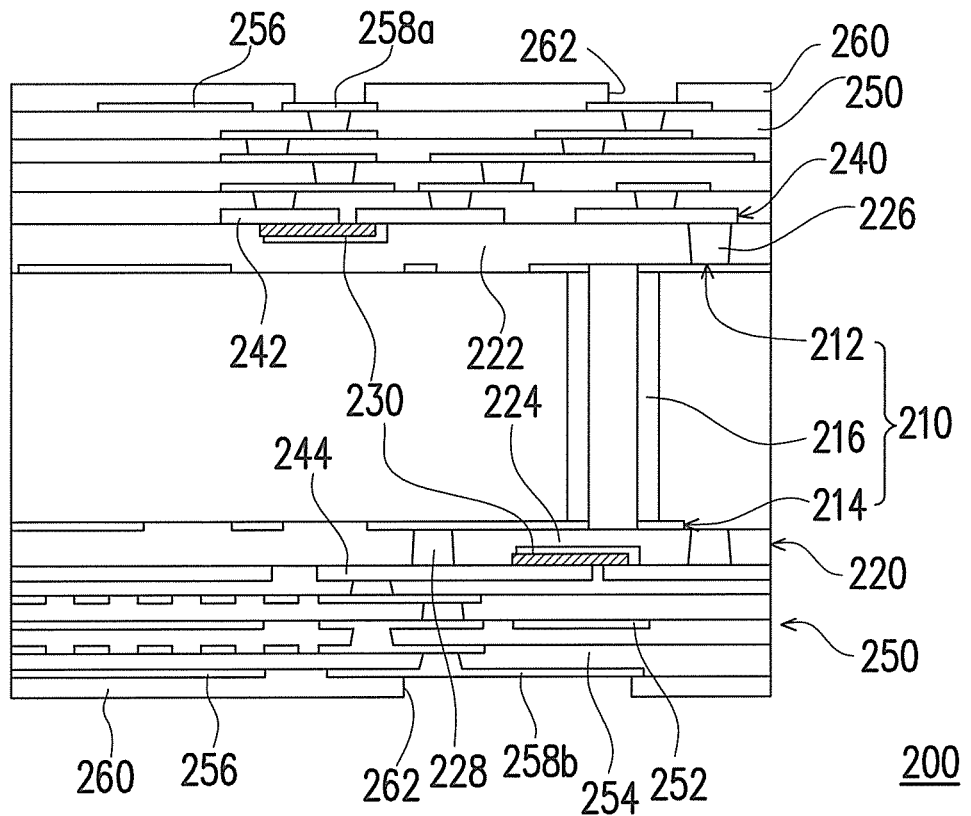
FIG. 2 is a schematic diagram of a portion of a package substrate having embedded capacitor according to a first embodiment of the present invention.

FIG. 2 is a schematic diagram of a portion of a package substrate having embedded capacitor according to a first embodiment of the present invention. The package substrate 200 mainly includes a core circuit board 210, a dielectric layer 220, at least one embedded capacitor 230 and a metal layer 240. The core circuit board 210 is, for example, a copper foil substrate with glass fiber and epoxy resin serving as insulating material so as to enhance the strength and support of the package substrate 200. In addition, the core circuit board 210 has at least one conductive through hole 216. The method of forming the conductive through hole 216 includes, for example, performing a mechanical drilling to form a through hole and then performing an electrochemical plating to form a layer of conductive material on the inner sidewall of the through hole. As a result, the upper and lower copper foils are connected through the conductive through hole 216. After an etching operation is performed to pattern the copper foils, a wiring layer for transmitting signals is formed.

As shown in FIG. 2, the embedded capacitor 230 of the present invention is disposed in the dielectric layer 220. The dielectric layer 220 may include a first dielectric layer 222 and a second dielectric layer 224 that covers a first wiring layer 212 and a second wiring layer 214 of the core circuit board 210 respectively. It should be noted that because the conductive through hole 216 has already formed in the core circuit board 210 earlier on, there is no need to perform the process in a subsequent process. Therefore, the location of the conductive through hole 216 will not affect the space for disposing the embedded capacitor. As shown in FIG. 2, the embedded capacitor 230 can be disposed in the first dielectric layer 222 underneath the conductive through hole 216. Since the disposition of embedded capacitor 230 is unaffected by the conductive through hole 216, the space and degree of freedom of disposing the embedded capacitor 230 are enhanced.

In the present embodiment, the embedded capacitors 230 can be discrete capacitors. The capacitors are pre-soldered to a metal layer 240 (for example, a copper foil) and then the dielectric layer 220 and the metal layer 240 are compressed to the core circuit board 210 so that the embedded capacitor 230 is embedded in the dielectric layer 220. Obviously, epoxy-ceramic composite with high dielectric constant can be used as the embedded capacitor 230 to increase the capacitance. The metal layer 240 may include a first metal layer 242 and a second metal layer 244. The first metal layer 242 covers the first dielectric layer 222, and the first metal layer 242 can be connected to the first wiring layer 212 through a conductive via 226 in the first dielectric layer 222. In addition, the second metal layer 244 covers the second dielectric layer 224, and the second metal layer 244 can be connected to the second wiring layer 214 through a conductive via 228 in the second dielectric layer 224.

As mentioned above, the conventional discrete capacitor has a relatively low capacitance. In the present embodiment, epoxy resin-ceramic composite capacitor or other ceramic/polymer composite capacitor with high dielectric constant is used so that the capacitance is increased and the dielectric loss is reduced. Hence, the performance of the package substrate 200 is enhanced.

In the present embodiment, a build-up method can be used to sequentially fabricate multiple layers of interconnect structures 250 after the process for assembling the embedded capacitor is completed so that the original four circuit layer substrate is increased to six, eight, ten or twelve circuit layer substrate. By drilling a plurality of blind holes with laser and then filling the blind holes with conductive material, two neighboring wiring layers 252 are connected. Finally, a solder mask layer 260 covers a surface wiring layer 256 in the outermost layer of the package substrate 200. The solder mask layer 260 has at least one opening 262 that exposes a contact of the surface wiring layer 256. In the present embodiment, a top contact 258a is used for electrically connecting to at least one chip or passive element (not shown), and a bottom contact 258b is used for electrically connecting to a printed circuit board (not shown). Hence, the package substrate 200 serves as a signal transmission medium between the top and bottom elements.

Figure 3:
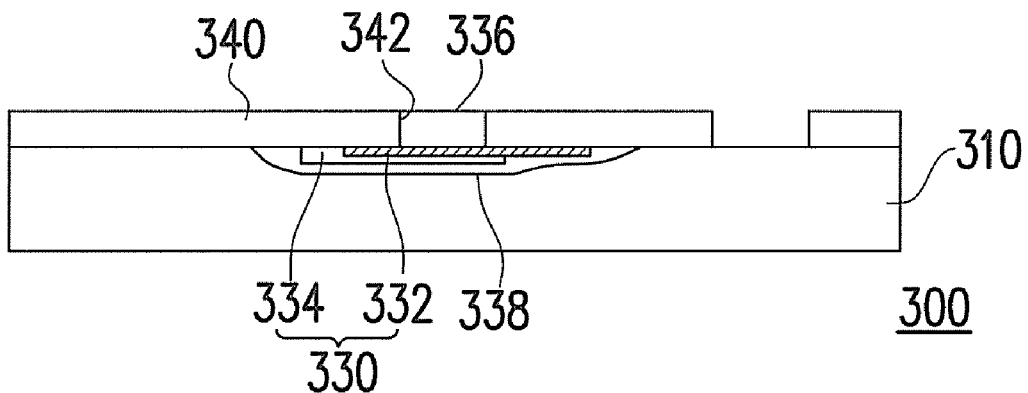
FIG. 3 is a schematic diagram of a portion of a package substrate having embedded capacitor according to a second embodiment of the present invention.

FIG. 3 is a schematic diagram of a portion of a package substrate having embedded capacitor according to a second embodiment of the present invention. The package substrate 300 mainly includes a core board 310, at least one embedded capacitor 330, a first passivation layer 338 and a metal layer 340. The core board 310 is a substrate fabricated using glass fibers and epoxy resin as its insulating material so as to enhance the strength and support of the package substrate 300. In addition, the embedded capacitor 330 is embedded in the core board 310 and electrically connected to the metal layer 340. In the present embodiment, the embedded capacitor 330 can be an epoxy resin-ceramic composite capacitor or other ceramic/polymer composite capacitor with high dielectric constant formed on the metal layer 340 after performing a high-temperature sintering process. Afterwards, electrode material covers the dielectric material 332 to form an electrode 334 connected to the metal layer 340.

To prevent the compressing process from breaking or damaging the embedded capacitors 330, the first passivation layer 338 is formed to cover the embedded capacitors 330 before compressing the substrate. The first passivation layer 338 is fabricated from polymer material such as epoxy resin or polyimide. The first passivation layer 338 not only has higher pressure resistant strength, but also has the characteristics of preventing the reactants of etching process, plating process and surface treatment process performed prior to the compression process from affecting the embedded capacitors 330 and their electrodes. In addition, the interior of an opening 342 on another side of the metal layer 340 can be selectively filled with a second passivation layer 336 to cover a surface of the embedded capacitor 330. The material and function of the second passivation layer 336 are identical to the first passivation layer 338 and similarly prevent the embedded capacitors 330 from possible damage.

Figure 4:
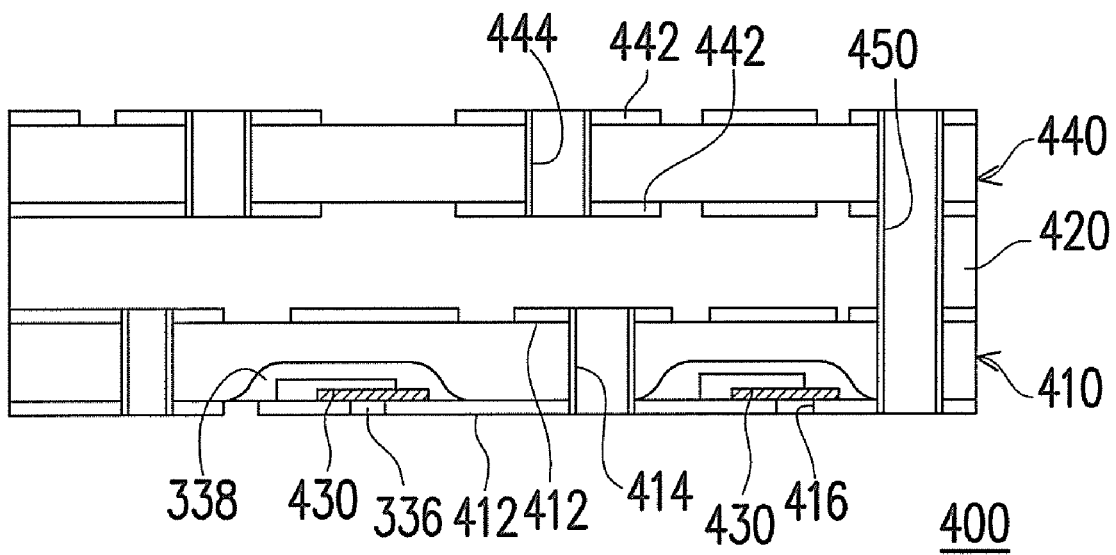
FIG. 4 is a schematic diagram of a portion of a package substrate having embedded capacitor according to a third embodiment of the present invention.

FIG. 4 is a schematic diagram of a portion of a package substrate having embedded capacitor according to a third embodiment of the present invention. The package substrate 400 mainly includes a first core circuit board 410, a dielectric layer 420, at least one embedded capacitor 430 and a second core circuit board 440. The first and second core circuit boards 410 and 440 are, for example, copper foil substrates using glass fiber or epoxy resin as the insulating material so as to enhance the strength and support of the package substrate 400. In addition, the dielectric layer 420 can be cured or semi-cured glass fiber epoxy resin laminated between the first and the second core circuit board 410 and 440. In the present embodiment, the two opposing surfaces of the first core circuit board 410 have a metal layer 412 and at least one first conductive through hole 414 of the first core circuit board 410 is connected to the metal layer 412. The embedded capacitor 430 is embedded in the first core circuit board 410 and connected to the metal layer 412. Similarly, the two opposing surfaces of the second core circuit board 440 have a wiring layer 442 and at least one second conductive through hole 444 of the second core circuit board 440 is connected to the wiring layer 442.

As described in above, the embedded capacitors 430 in the present embodiment can be epoxy resin-ceramic composite capacitors or other ceramic/polymer composite capacitors with high dielectric constant so as to enhance the performance of the package substrate 400. Furthermore, before compressing the substrate, the first passivation layer 338 in FIG. 3 can be used to cover the embedded capacitors 430 in FIG. 4. Similarly, the second passivation layer 336 can be used to fill the opening 416 on the other side of the metal layer 412 to protect the embedded capacitors 430 and their electrodes.

Similarly, as shown in FIG. 4, a conductive through hole 450 connecting the metal layer 412 and the wiring layer 442 can be formed in the package substrate 400 of the present invention by mechanically drilling to form a through hole and performing an electrochemical plating process to form a conductive layer on the inner sidewall of the through hole. Obviously, the conductive through hole 450 can be filled with insulating or conductive filling material 452 according to the thickness of the package substrate 400 whose details are omitted. In addition, a build-up method or other process can be used to sequentially fabricate multiple layers of interconnect structures (not shown) according to the circuit requirements after the process for forming the embedded capacitors 430 is completed. Furthermore, a solder mask layer covers the outermost surface wiring layer like the one in FIG. 1. The solder mask layer has at least one opening exposing a contact on the surface wiring layer so that the package substrate 400 serves as a signal transmission medium between the top and bottom elements.

Figure 5:
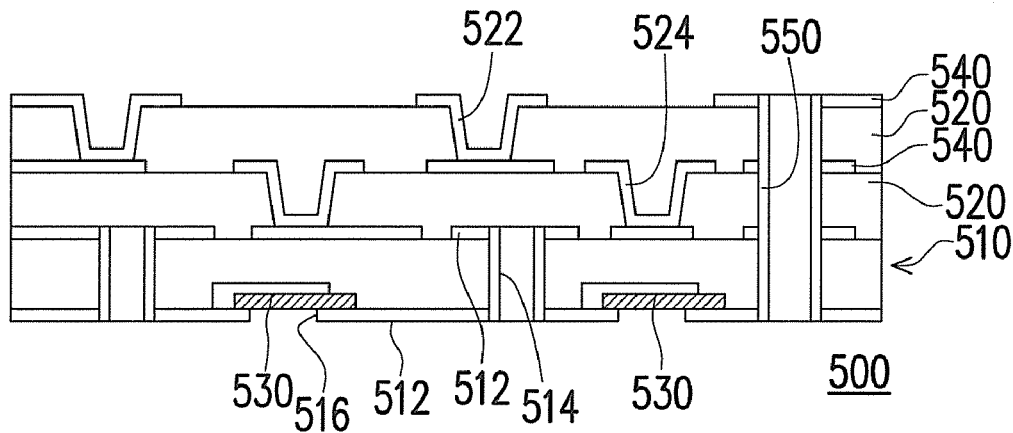
FIG. 5 is a schematic diagram of a portion of a package substrate having embedded capacitor according to a fourth embodiment of the present invention.

FIG. 5 is a schematic diagram of a portion of a package substrate having embedded capacitor according to a fourth embodiment of the present invention. The package substrate 500 mainly includes a core circuit board 510, at least one dielectric layer 520, at least one embedded capacitor 530 and at least one wiring layer 540. The core circuit board 510 is, for example, a copper foil substrate fabricated using glass fibers and epoxy resin so as to enhance the strength and support of the package substrate 500. In addition, the dielectric layer 520 can be cured or semi-cured epoxy resin or polyimide covering the core circuit board 510 using a build-up method. In the present embodiment, the two opposing surfaces of the core circuit board 510 have a metal layer 512 and at least one conductive through hole 514 of the core circuit layer 510 connected to the metal layers 512. The embedded capacitors 530 are embedded in the core circuit board 510 and connected to the metal layers 512.

In the present embodiment, the dielectric layer 520 can be a single layer or multiple layers and the wiring layer 540 can be a single layer or multiple layers. Using multiple layers as an example, the dielectric layer 520 has a plurality of laser-drilled and conductive material filled via holes 522 for electrically connecting neighboring upper and lower wiring layers 540. Obviously, the wiring layer 540 can be connected to one of the metal layers 512 through the via hole 524. Alternatively, the metal layers 512 are connected to the wiring layer 540 through a through hole 550 passing through the core circuit board 510, the dielectric layer 520 and the wiring layer 540 of the package substrate 500.

As described in above, the embedded capacitors 530 in the present embodiment can be epoxy resin-ceramic composite capacitors or other ceramic/polymer composite capacitors with high dielectric constant so as to enhance the performance of the package substrate 400. Furthermore, before compressing the substrate, the first passivation layer 338 in FIG. 3 can be used to cover the embedded capacitors 530 in FIG. 5. (not shown) Similarly, the second passivation layer 336 can be used to fill the opening 516 on the other side of the metal layer 512 to protect the embedded capacitors 530 and their electrodes.

Similarly, a build-up method or other process can be used to sequentially fabricate multiple layers of interconnect structures (not shown) according to the circuit requirements after the process for forming the embedded capacitors 530 is completed. Furthermore, a solder mask layer covers the outermost surface wiring layer like the one in FIG. 1. The solder mask layer has at least one opening exposing a contact on the surface wiring layer so that the package substrate 500 serves as a signal transmission medium between the top and bottom elements.

Figure 6:
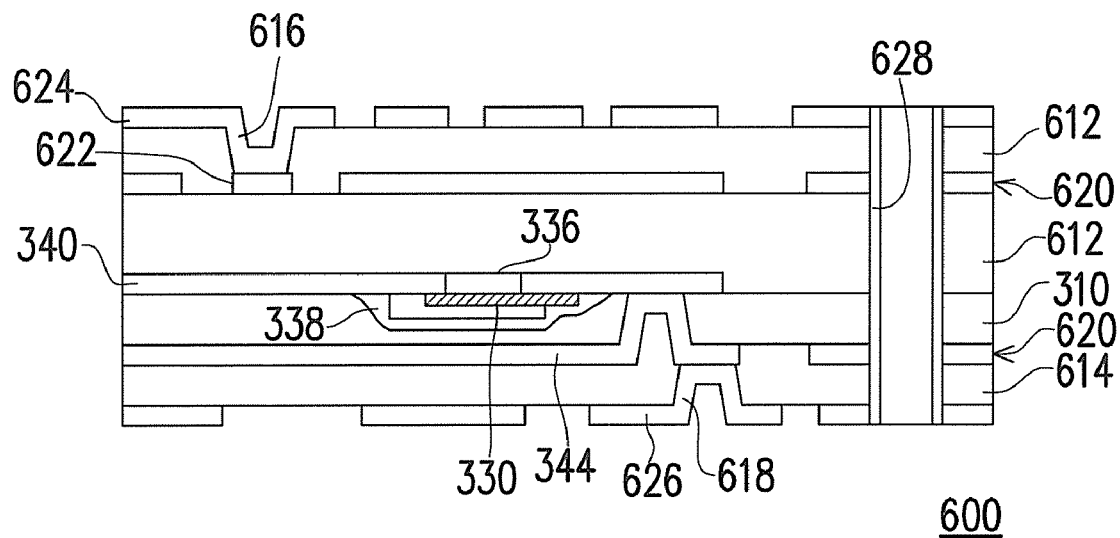
FIG. 6 is a schematic diagram of a portion of a package substrate using the substrate having embedded capacitor in FIG. 3 as the core layer.

FIG. 6 is a schematic diagram of a portion of a package substrate using the substrate having embedded capacitor in FIG. 3 as the core layer. After the process for assembling the embedded capacitors 330 is completed, a build-up method or other process can be used to sequentially fabricate multiple layers of interconnect structures 602 on the package substrate 600 according to the circuit requirements. The interconnect structure 602 includes at least one dielectric layer 610 and at least one wiring layer 620. Using multiple layers as an example, the dielectric layer 610 includes a plurality of first dielectric layers 612 and a second dielectric layer 614. The first dielectric layer 612 covers the first metal layer 340, and the second dielectric layer 614 covers the core board 310 or second metal layer 344. In addition, the wiring layer 620 includes a plurality of first wiring layers 622, 624 and a second wiring layer 626. The first wiring layers 622, 624 are connected to each other through a via hole 616 in the first dielectric layer 612. The second wiring layer 626 is connected to the second metal layer 344 through a via hole 618 in the second dielectric layer 614. Furthermore, at least one conductive through hole 628 can be used to connect between the first wiring layers 622, 624 and the second wiring layer 626.

In summary, the embedded capacitor in the present invention can be disposed in a suitable location without having to avert the conductive through holes due to an improvement of the substrate structure. Therefore, the space and degree of freedom for disposing the embedded capacitors are enhanced. In addition, capacitors fabricated using high dielectric constant and low dielectric loss material such as polymer-ceramic composite instead of the conventional discrete capacitors can be used so as to enhance the performance of the package substrate. Furthermore, the embedded capacitors of the present invention are covered with at least one passivation layer to prevent the embedded capacitors from receiving possible damage in the process of compressing the substrate. Hence, overall reliability of the package substrate is improved.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A package substrate having embedded capacitor, comprising:
    a core circuit board having at least one wiring layer, and the core circuit board has at least one conductive through hole connected to the wiring layer;
    at least one dielectric layer covering the wiring layer, and the dielectric layer has at least one conductive through hole;
    at least one embedded capacitor, embedded in the dielectric layer, wherein an orthogonal projection of the embedded capacitor on the core circuit board overlaps the conductive through hole; and
    at least one metal layer covering the dielectric layer and connected to the embedded capacitor, wherein the metal layer is connected to the wiring layer through the conductive through hole.

2. The package substrate of claim 1, wherein the at least one embedded capacitor is disposed in a location in the dielectric layer corresponding to the conductive through hole.

3. The package substrate of claim 1, wherein the at least one wiring layer comprises a first wiring layer and a second wiring layer disposed on two opposing surface of the core circuit board.

4. The package substrate of claim 3, wherein the at least one dielectric layer comprises a first dielectric layer and a second dielectric layer, and the first dielectric layer covers the first wiring layer and the second dielectric layer covers the second wiring layer.

5. The package substrate of claim 4, wherein the at least one metal layer comprises a first metal layer and a second metal layer, and the first metal layer covers the first dielectric layer and the second metal layer covers the second dielectric layer.

6. The package substrate of claim 1, further comprising a first passivation layer that covers the embedded capacitor.

7. The package substrate of claim 1, wherein the metal layer has an opening that exposes a surface of the embedded capacitor and the package substrate further comprise a second passivation layer that covers the surface.

8. The package substrate of claim 6, wherein the first passivation layer is made of epoxy resin or polyimide.

9. The package substrate of claim 1, further comprising at least one surface wiring layer disposed on a surface of the package substrate, and the surface wiring layer has at least one contact electrically connected to the metal layer.

10. The package substrate of claim 9, further comprising a solder mask layer that covers the surface wiring layer and the solder mask layer has at least one opening that exposes the contact.

* * * * *